(12) United States Patent
Kitabayashi

(10) Patent No.: US 9,449,823 B2
(45) Date of Patent: Sep. 20, 2016

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventor: Hiroyuki Kitabayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/441,137

(22) PCT Filed: Dec. 6, 2013

(86) PCT No.: PCT/JP2013/082788
§ 371 (c)(1),
(2) Date: May 6, 2015

(87) PCT Pub. No.: WO2014/112240
PCT Pub. Date: Jul. 24, 2014

(65) Prior Publication Data
US 2015/0287597 A1    Oct. 8, 2015

(30) Foreign Application Priority Data
Jan. 21, 2013   (JP) ................................ 2013-008186

(51) Int. Cl.
*H01L 21/04* (2006.01)
*H01L 29/66* (2006.01)
*H01L 29/78* (2006.01)
*H01L 29/16* (2006.01)
*H01L 21/683* (2006.01)
*H01L 21/304* (2006.01)
*H01L 21/3065* (2006.01)

(52) U.S. Cl.
CPC ....... *H01L 21/0485* (2013.01); *H01L 21/0475* (2013.01); *H01L 21/304* (2013.01);
(Continued)

(58) Field of Classification Search
CPC ............. H01L 21/0485; H01L 21/304; H01L 21/3065; H01L 21/6835; H01L 21/0475; H01L 21/6836; H01L 29/7827; H01L 29/1608; H01L 29/66068; H01L 2221/68381; H01L 2221/68327; H01L 2221/6834
See application file for complete search history.

(56) References Cited

U.S. PATENT DOCUMENTS 9,082,881 B1 *   7/2015   Hackler, Sr. ............ H01L 21/84
2005/0250295 A1   11/2005   Mita
(Continued)

FOREIGN PATENT DOCUMENTS

JP    2003-297786 A    10/2003
JP    2004-335835 A    11/2004
(Continued)

OTHER PUBLICATIONS

International Search Report for PCT Application PCT/JP2013/082788 dated Jan. 14, 2014.

*Primary Examiner* — John P Dulka
(74) *Attorney, Agent, or Firm* — Venable LLP; Michael A. Sartori; F. Brock Riggs

(57) ABSTRACT

In a state where a silicon carbide substrate having a first main surface and second main surface opposite to each other is fixed to a base material having a higher flexibility than the silicon carbide substrate, silicon carbide on a side of second main surface of silicon carbide substrate is removed, and an electrode is formed on the second main surface. The base material has an area which is smaller than or equal to an area of the first main surface of the silicon carbide substrate. In the step of fixing silicon carbide substrate to the base material, the base material is arranged at a position of covering a center of the first main surface so that the base material does not extend beyond an outer circumference of the first main surface.

10 Claims, 8 Drawing Sheets

(52) U.S. Cl.
CPC ....... *H01L21/3065* (2013.01); *H01L 21/6835* (2013.01); *H01L 21/6836* (2013.01); *H01L 29/1608* (2013.01); *H01L 29/66068* (2013.01); *H01L 29/7827* (2013.01); *H01L 2221/6834* (2013.01); *H01L 2221/68327* (2013.01); *H01L 2221/68381* (2013.01)

(56) References Cited

U.S. PATENT DOCUMENTS

| | | |
|---|---|---|
| 2007/0066039 A1 | 3/2007 | Agarwal et al. |
| 2008/0230911 A1* | 9/2008 | Li .................... H01L 21/268 257/757 |
| 2009/0166896 A1 | 7/2009 | Yamazaki et al. |
| 2012/0211770 A1 | 8/2012 | Shiomi et al. |
| 2012/0225537 A1* | 9/2012 | Horii .................... H01L 21/6836 438/460 |
| 2013/0140269 A1* | 6/2013 | Chiang .................. B82Y 10/00 216/12 |

FOREIGN PATENT DOCUMENTS

| | | |
|---|---|---|
| JP | 2009-054965 A | 3/2009 |
| JP | 4239974 B2 | 3/2009 |
| JP | 2009-177144 A | 8/2009 |
| JP | 2012-178603 A | 9/2012 |
| WO | WO-2011/142288 A1 | 11/2011 |
| WO | WO-2012/035880 A1 | 3/2012 |
| WO | WO-2012/049792 A1 | 4/2012 |

* cited by examiner

METHOD FOR MANUFACTURING SILICON CARBIDE SEMICONDUCTOR DEVICE

TECHNICAL FIELD

The present invention relates to a method for manufacturing a silicon carbide semiconductor device, and more particularly to a method for manufacturing a silicon carbide semiconductor device including the step of fixing a silicon carbide substrate to a base material.

BACKGROUND ART

In recent years, silicon carbide has been employed as a material constituting a semiconductor device to achieve a high breakdown voltage and a low loss in the semiconductor device, Silicon carbide is a wide band gap semiconductor having a larger band gap as compared to silicon which has been widely used as a material constituting a conventional semiconductor device. Therefore, employing silicon carbide as a material constituting a semiconductor device can achieve a high breakdown voltage and a reduction of on-resistance in the semiconductor device. Moreover, a semiconductor device employing silicon carbide as a material also has an advantage that deterioration of the property in the use under a high-temperature environment is smaller as compared to a semiconductor device employing silicon as a material.

In the step of forming an electrode with respect to a silicon carbide semiconductor device, there is a case where one face of a silicon carbide substrate is fixed to a supporting substrate to form an electrode on the other face. For example, Japanese Patent Laying-Open No. 2012-178603 (PTD 1) discloses the steps of attaching one face of a silicon carbide substrate to a carrier substrate made of sapphire or the like, detaching the carrier substrate from the silicon substrate after grinding the other face, and forming an ohmic contact on the other face. Moreover, WO2012/035880 (PTD 2) discloses the steps of fixing one face of a silicon carbide substrate to an adhesive tape and on the other hand grinding the other face, and thereafter forming a back surface electrode on the other face.

CITATION LIST

Patent Document

PTD 1: Japanese Patent Laying-Open No. 2012-178603
PTD 2: WO2012/035880

SUMMARY OF INVENTION

Technical Problem

According to the method disclosed in Japanese Patent Laying-Open No. 2012-178603, the silicon carbide substrate is fixed to the carrier substrate by means of an adhesive such as wax. When the silicon carbide substrate is detached from the carrier substrate, the step of melting the adhesive such as wax is required. Therefore, the manufacturing step is complicated.

Moreover, when the electrode is formed on the silicon carbide substrate by the method disclosed in WO 20121035880 (PTD 2), a contact resistance between the silicon carbide substrate and the electrode becomes large.

The present invention was made in view of the problem described above, and its object is to provide a method for manufacturing a silicon carbide semiconductor device which can reduce a contact resistance between a silicon carbide substrate and an electrode and manufacture a silicon carbide semiconductor device in a simple manner.

Solution to Problem

As a result of conducting a diligent study on the cause of a high contact resistance between a silicon carbide substrate and an electrode when the electrode is formed on the silicon carbide substrate in the state where the silicon carbide substrate is fixed to an. adhesive tape, the inventor obtained the following knowledge and made the present invention.

When a metallic film is formed on a silicon carbide substrate through, for example, sputtering while fixing the silicon carbide substrate on the adhesive tape, and if the adhesive tape fixing the silicon carbide substrate extends beyond an outer circumference of the silicon carbide substrate, impurities are generated from the extending part of the adhesive tape, and the impurity gas oxidizes the metallic film formed on the silicon carbide substrate. It was found that, if the electrode is thereafter formed by annealing the metallic film, a contact resistance between the silicon carbide substrate and the electrode is increased. Moreover, after analyzing the components of the impurity gas, it was found that the main component of the impurity gas was $H_2O$ (vapor). It is considered that the metallic film is oxidized by a reaction of the $H_2O$ (vapor) with the metallic film.

The method for manufacturing a silicon carbide semiconductor device according to the present invention includes the following steps. A silicon carbide substrate having a first main surface and a second main surface opposite to each other is fixed to a base material having a higher flexibility than the silicon carbide substrate. Silicon carbide on a side of the second main surface of the silicon carbide substrate is removed in a state where the silicon carbide substrate is fixed to the base material. An electrode is formed on the second main surface of the silicon carbide substrate from which the silicon carbide is removed in the state where the silicon carbide substrate is fixed to the base material. The base material has an area which is less than or equal to an area of the first main surface of the silicon carbide substrate. In the step of fixing to a base material, the base material is arranged at a position of covering a center of the first main surface so that the base material does not extend beyond an outer circumference of the first main surface.

According to the method for manufacturing a silicon carbide semiconductor device of the present invention, the silicon carbide substrate is fixed to the base material so that the base material does not extend beyond the outer circumference of the first main surface of the silicon carbide substrate, and the electrode is formed on the second main surface of the silicon carbide substrate in the state where the silicon carbide substrate is fixed the base material. Accordingly, when the electrode is formed, generation of impurities such as vapor from the base material can be suppressed. Consequently, since a rise in a contact resistance between the silicon carbide substrate and the electrode due to impurities such as vapor can be suppressed, a silicon carbide semiconductor device having a low contact resistance between a silicon carbide substrate and a electrode can be manufactured.

Moreover, according to the method for manufacturing a silicon carbide semiconductor device of the present invention, the silicon carbide substrate is fixed to the base material having a higher flexibility than the silicon carbide substrate. Therefore, the base material can be removed from the silicon carbide substrate without giving an excessive stress to the silicon carbide substrate. Consequently, a silicon carbide semiconductor device can be manufactured in a simple manner without using a solvent or the like for removal of a base material.

Preferably, in the method for manufacturing a silicon carbide semiconductor device, the first main surface includes an outer circumferential region, which is a region within 1.5 mm from the outer circumference of the first main surface to the center, and a central region surrounded by the outer circumferential region. The base material entirely covers the central region entirely. Accordingly, the central region of the silicon carbide substrate can be protected entirely by the base material.

Preferably, in the method for manufacturing a silicon carbide semiconductor device, the step of removing silicon carbide includes the grinding step. Accordingly, the silicon carbide substrate can have a desired thickness efficiently.

Preferably, in the method for manufacturing, a silicon carbide semiconductor device, the step of removing silicon carbide further includes the dry etching step implemented after the grinding step. In the step of dry etching, a process damaged layer formed on the second main surface in the step of grinding is removed. Accordingly, the contact resistance between the silicon carbide substrate and the electrode can be further reduced.

Preferably, in the method for manufacturing a silicon carbide semiconductor device, the step of removing silicon carbide further includes the sputter etching step implemented after the dry etching step. Accordingly, impurities adhered to the silicon carbide substrate in the step of dry etching can be removed. Consequently, the contact resistance between the silicon carbide substrate and the electrode can be further reduced.

Preferably, in the method for manufacturing a silicon carbide semiconductor device, the silicon carbide substrate is retained in vacuum from the dry etching step through the step of forming an electrode. Accordingly, oxidization of the second main surface of the silicon carbide substrate can be suppressed. Consequently, the contact resistance between the silicon carbide substrate and the electrode can be further reduced.

Preferably, in the method for manufacturing a silicon carbide semiconductor device, the second main surface is a silicon surface. Accordingly, in the case where the second main surface is a silicon surface, the contact resistance between the silicon carbide substrate and the electrode can be reduced.

Preferably, in the method for manufacturing a silicon carbide semiconductor device, the base material includes a base portion and an adhering portion connected to the base portion. In the step of fixing to a base material, the silicon carbide substrate is fixed to the base portion by the adhering portion. Accordingly, the silicon carbide substrate is fixed to the base material in a simple manner.

Preferably, in the method for manufacturing a silicon carbide semiconductor device, the base portion is made of organic compounds. Accordingly, a flexibility of the base material can be improved.

Preferably, in the method for manufacturing a silicon carbide semiconductor device, the adhering portion has a property that an adhesion is lowered by heating. Accordingly, the silicon carbide substrate can be removed from the base material in a simple manner.

Preferably, in the method for manufacturing a silicon carbide semiconductor device, the adhering portion has a property that an adhesion is lowered by irradiation of ultraviolet rays, Accordingly, the silicon carbide substrate can be removed from the base material in a simple manner.

Advantageous Effects of Invention

As is apparent from the description above, according to the present invention, a method for manufacturing a silicon carbide semiconductor device can be provided which can reduce a contact resistance between a silicon carbide substrate and an electrode and manufacture the silicon carbide semiconductor device in a simple manner.

DESCRIPTION OF EMBODIMENT

Figure 1:
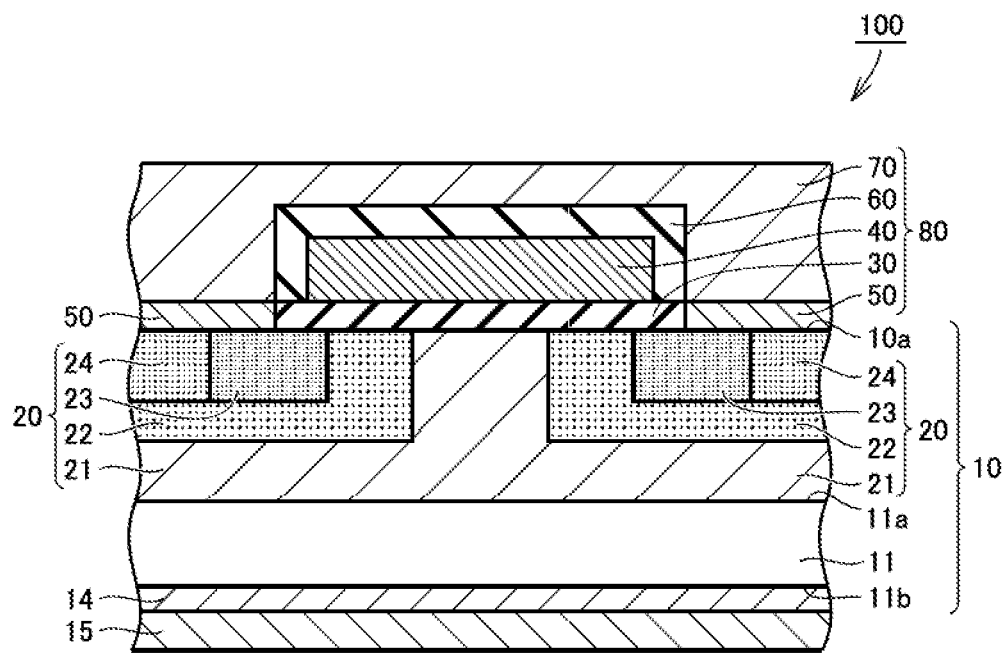
FIG. 1 is a schematic cross-sectional view schematically representing a configuration of a silicon carbide semiconductor device manufactured by a method for manufacturing a silicon carbide semiconductor device according to one embodiment of the present invention.

Hereinafter, the embodiment of the present invention will be described with reference to the drawings. In the drawings below, the same or corresponding elements have the same reference characters allotted, and description thereof will not be repeated. Regarding the crystallographic description in the specification, an individual orientation is indicated by [], and a group orientation is indicated by <>, and an individual plane is indicated by ( ), and a group plane is indicated by {}. Moreover, while a negative index should be indicated by adding "–" (bar) above numeral in view of the crystallography, a negative sign is allotted before numeral in the specification. For description of angles, a system having a total orientation angles of 360 degrees is used.

Firstly, one example of a silicon carbide semiconductor device manufactured by the manufacturing method according to one embodiment of the present invention will be described. Firstly, a configuration of a MOSFET (Metal Oxide Semiconductor Field Effect Transistor) as a silicon carbide semiconductor device will be described.

Referring to FIG. 1, a MOSFET 100 mainly includes an intermediate silicon carbide substrate 10, an upper element structure 80, a drain electrode 14, and a back surface protection electrode 15.

Intermediate silicon carbide substrate 10 has, for example, a base silicon carbide substrate 11 and an epitaxial layer 20. Base silicon carbide substrate 11 is a substrate which is made of, for example, hexagonal crystal silicon carbide of polytype 4H, and a conductivity type including impurities such as nitrogen is n-type.

Base silicon carbide substrate 11 has a first main surface 11a and a second main surface 11b opposite to each other. Preferably, first main surface 11a is a C (carbon) surface, in other words, a (000-1) plane, and second main surface 11b is an Si (silicon) surface, in other words, a (0001) plane. First main surface 11a may be a surface which is offset from the C surface by approximately 8° or less, and second main surface 11b may be a surface which is offset from the Si surface by approximately 8° C. or less.

Epitaxial layer 20 is an epitaxial region which is provided on first main surface 11a of base silicon carbide substrate 11 and made of silicon carbide. Epitaxial layer 20 has a drift region 21, body region 22, a source region 23, and a p+ region 24. Drift region 21 is a region having a conductivity type of n-type, and the impurity concentration in drift region 21 is lower than the impurity concentration of base silicon carbide substrate 11. Body region 22 is a region having a conductivity type of p-type. The impurities contained in body region 22 are, for example, Al (aluminum) and B (boron), which are contained at the concentration of for example, $1\times10^{17}$ cm$^{-3}$ which is lower than the concentration of the impurities contained in base silicon carbide substrate 11.

Source region 23 is an n-type region having a conductivity type of n-type. Source region 23 is formed inside of body region 22 so as to include main surface 10a of intermediate silicon carbide substrate 10 and to be surrounded by body region 22. Source region 23 contains impurities such as P (phosphorus) at the concentration of, for example, $1\times10^{20}$ cm$^{-3}$ which is higher than the concentration of impurities contained in drift region 21.

P+ region 24 is a p-type region having a conductivity type of p-type, P+ region 24 is formed in contact with source region 23 and body region 22. P+ region. 24 includes impurities such as Al and B at the concentration higher than the concentration of the impurities contained in body region 22, The impurity concentration of Al and B in p+ region 24 is, for example, $1\times10^{20}$ cm$^{-3}$.

Upper element structure 80 mainly includes agate oxide film 30, a gate electrode 40, a source electrode 50, an interlayer insulating film 60, and a surface protection electrode 70. Gate oxide film 30 is formed on main surface 10a of intermediate silicon carbide substrate 10 so as to come in contact with main surface 10a of intermediate silicon carbide substrate 10 and extend from an upper surface of one source region 23 to an upper surface of the other source region 23. Gate oxide film 30 is formed in contact with source region 23, body region 22, and drift region 21. Gate oxide film 30 is made of, for example, silicon dioxide.

Gate electrode 40 is arranged in contact with gate oxide film 30 so as to extend from above one source region 23 to the other source region 23. Gate electrode 40 is formed above source region 23, body region 22, and drift region 21 through gate oxide film 30. Gate electrode 40 is made of a conductive body such as polysilicon and Al.

Source electrode 50 is arranged so as to extend from above a pair of source regions 23 to above p+ region 24 in a direction of leaving apart from gate oxide film 30 and come into contact with main surface 10a of intermediate silicon carbide substrate 10.

Interlayer insulating film 60 is provided in contact with gate electrode 40 and gate oxide film 30. Interlayer insulating film 60 electrically insulates gate electrode 40 and source electrode 50. Surface protection electrode 70 is formed to be in contact with source electrode 50 and made of a conductive body such as Al. Surface 2protection electrode 70 is electrically connected to source region 23 through source electrode 50.

Drain electrode 14 is formed in contact with the other main surface which is a main surface on a side opposite to one main surface which is a main surface on a side having drift region 21 formed thereon in base silicon carbide substrate 11. This drain electrode 14 may be made of other material such as NiSi (nickel silicon) which can be in ohmic contact with base silicon carbide substrate 11. Accordingly, drain electrode 14 is electrically connected to base silicon carbide substrate 11.

Back surface protection electrode 15 is formed in contact with a main surface of drain electrode 14 on a side opposite to base silicon carbide substrate 11. Back surface protection electrode 15 has a layered structure constituted of, for example, a Ti layer, a Pt layer, and an Au layer.

Next, the method for manufacturing a silicon carbide semiconductor device according to one embodiment of the present invention will be described.

Figure 2:
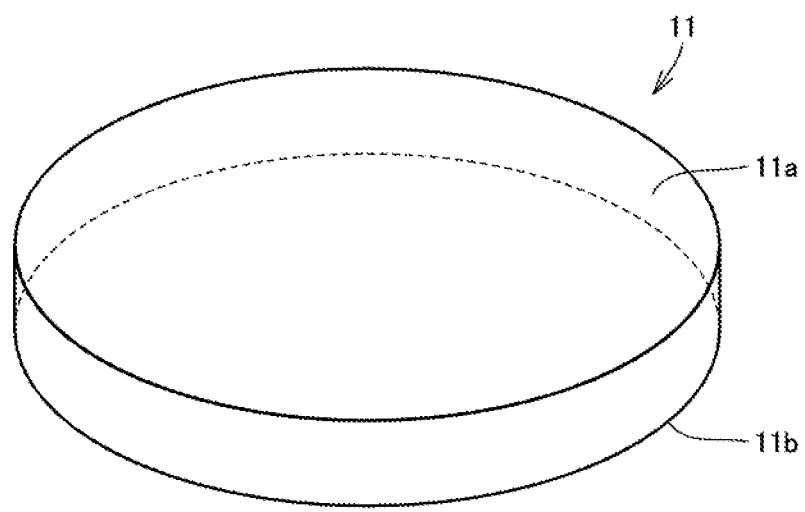
FIG. 2 is a schematic perspective view schematically representing a configuration of a silicon carbide substrate used in the method for manufacturing a silicon carbide semiconductor device according to one embodiment of the present invention.
Figure 3:
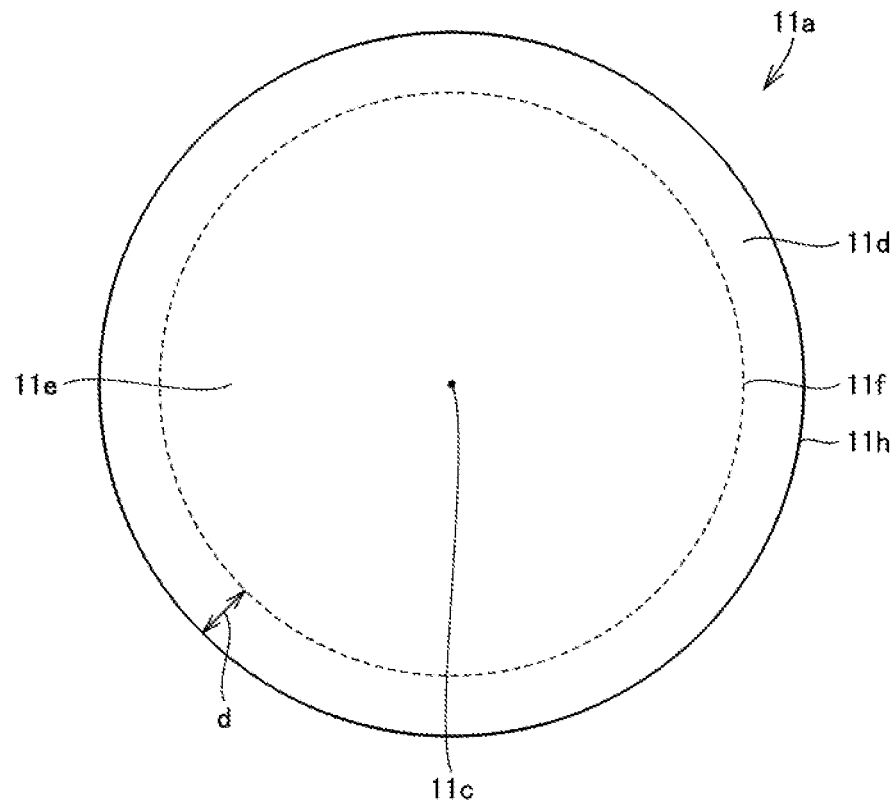
FIG. 3 is a schematic plan view schematically representing a configuration of the silicon carbide substrate used in the method for manufacturing a silicon carbide semiconductor device according to one embodiment of the present invention.
Figure 4:
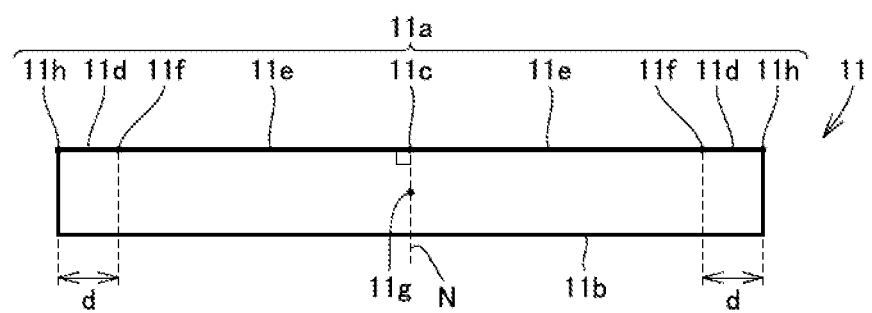
FIG. 4 is a schematic cross-sectional view schematically representing a configuration of the silicon carbide substrate used in the method for manufacturing a silicon carbide semiconductor device according to one embodiment of the present invention.
Figure 5:
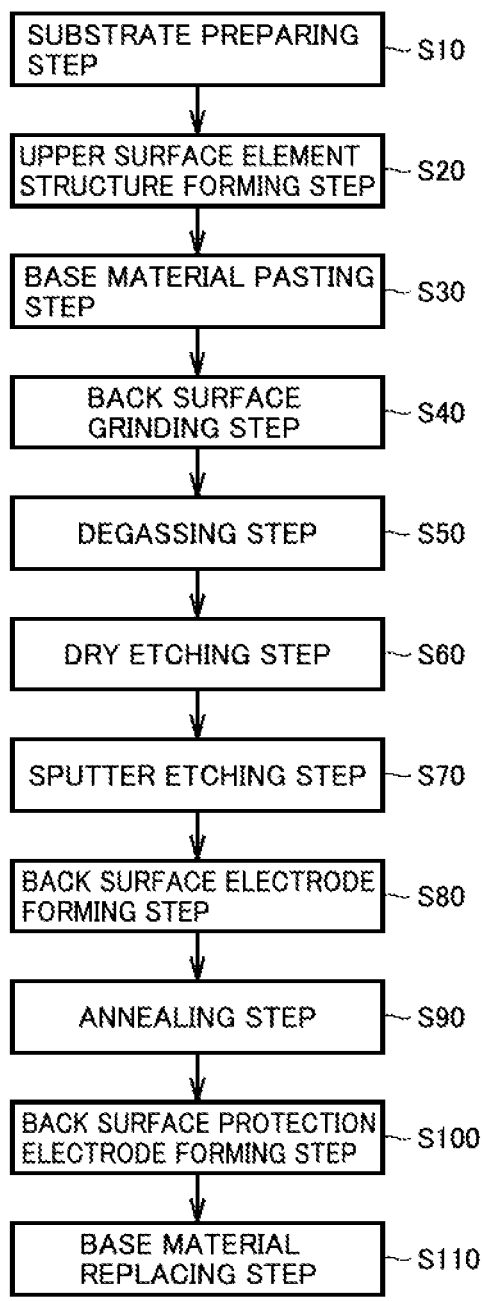
FIG. 5 is a flowchart schematically representing the method for manufacturing a silicon carbide semiconductor device according to one embodiment of the present invention.

Referring to FIGS. 2 to 4, firstly, a substrate preparing step is implemented as Step (S10: FIG. 5). In the substrate preparing step, an ingot (not illustrated) made of, for example, silicon carbide single crystal of polytype 4H is sliced, so that base silicon carbide substrate 11 made of hexagonal crystal silicon carbide of polytype 4H and having a conductivity type of n-type (first conductivity type) is prepared.

Referring to FIG. 2, base silicon carbide substrate 11 has a first main surface 11a and a second main surface 11b opposite to each other. Preferably, first main surface 11a is a C (carbon) surface, in other words, a (000-1) plane, and second main surface 11b is an Si (silicon) surface 11b, in other words, a (0001) plane. First main surface 11a may be a surface which is offset from the C surface by approximately 8° or less, and second main surface 11b may be a surface which is offset from the Si surface by approximately 8° or less.

Referring to FIG. 3, first main surface 11a of base silicon carbide substrate 11 includes an outer circumferential region 11d, which is a region within a distance d (for example, d=1.5 mm) from an outer circumference 11h of first main surface 11a, and a central region 11e, which is surrounded by outer circumferential region 11d. Distance d may be, for example, d=1.0 mm or d=0.5 mm. In other words, outer circumferential region 11d is in contact with central region 11e at an imaginary border line 11f.

Referring to FIG. 4, central region 11e is a region including a center 11c of first main surface 11a. For example, when first main surface 11a is a circle, center 11c of first main surface 11a is a center of the circle. When first main surface 11a has a shape other than a circle, center 11c of first main surface 11a is an intersection between a line N, which passes through the center of gravity 11g of base silicon carbide substrate 11 and is parallel to a normal line of first main surface 11a, and first main surface 11a.

Next the epitaxial layer forming step is implemented, in this step, epitaxial layer 20, which is made of for example, silicon carbide and has a conductivity type of n-type, is formed by the epitaxial growth on first main surface 11a of base silicon carbide substrate 11.

Figure 6:
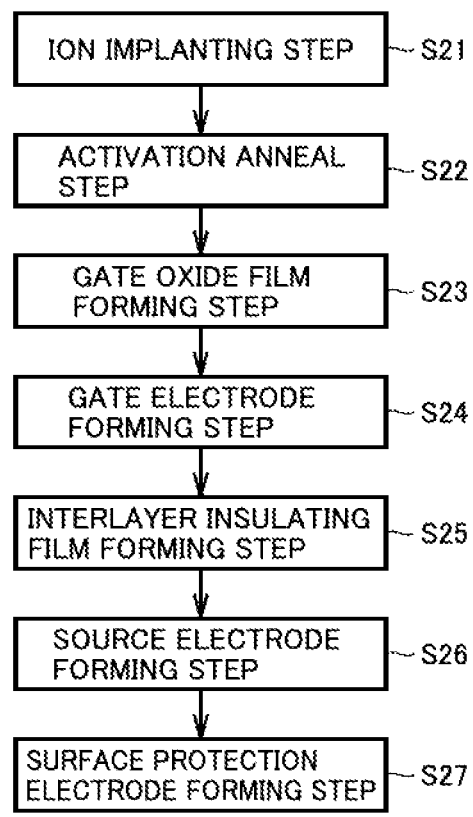
FIG. 6 is a flowchart schematically representing the method for manufacturing a silicon carbide semiconductor device according to one embodiment of the present invention.

Next, as Step (S20: FIG. 5), the upper surface element structure forming step is implemented. In the upper surface element structure forming step, Step (S21: FIG. 6) to Step (S27: FIG. 6), which will be described herebelow, are implemented to form upper element structure 80 on base silicon carbide substrate 11.

Figure 7:
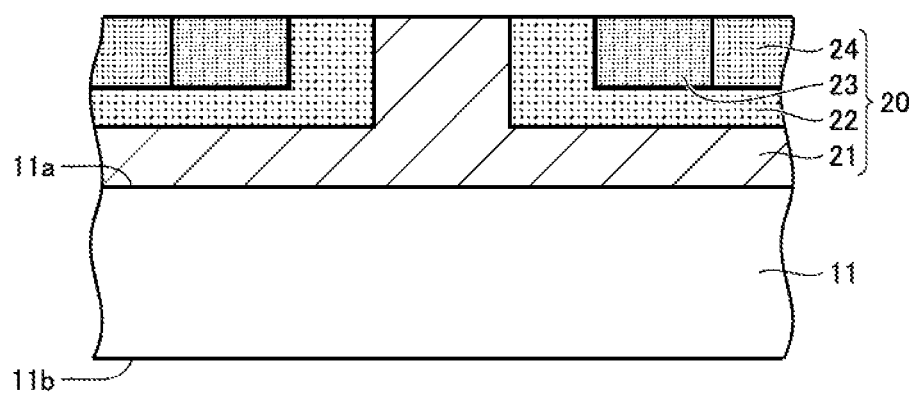
FIG. 7 is a schematic cross-sectional view schematically representing the first step of the method for manufacturing a silicon carbide semiconductor device according to one embodiment of the present invention.

Firstly, as Step (S21: FIG. 6), the ion implanting step is implemented. In this Step (S21: FIG. 6), referring to FIG. 7, Al (aluminum) ion for example is firstly implanted to main surface 10a of intermediate silicon carbide substrate 10 to form body region 22 having a conductivity type of p-type (second conductivity type) in epitaxial layer 20. Next, for example, P (phosphorus) ion is implanted to body region 22 at a depth smaller than the depth at which the Al ion is implanted to form source region 23 having a conductivity type of n-type. Then, for example, the Al ion is further implanted to body region 22 to form p+ region 24 having an equal depth with source region 23 while being adjacent to source region 23 and having a conductivity type of p-type. Moreover, in epitaxial layer 20, a region in which none of body region 22, source region 23, and p+ region 24 is formed is drift region 21.

Next, as Step (S22: FIG. 6), the active annealing step is implemented. In this Step (S22: FIG. 6), intermediate silicon carbide substrate 10 is heated, for example, at a temperature of 1700° C. for thirty minutes to activate the impurities introduced in Step (S21: FIG. 6) described above. Accordingly, a desired carrier is generated in the region to which the impurities are introduced.

Figure 8:
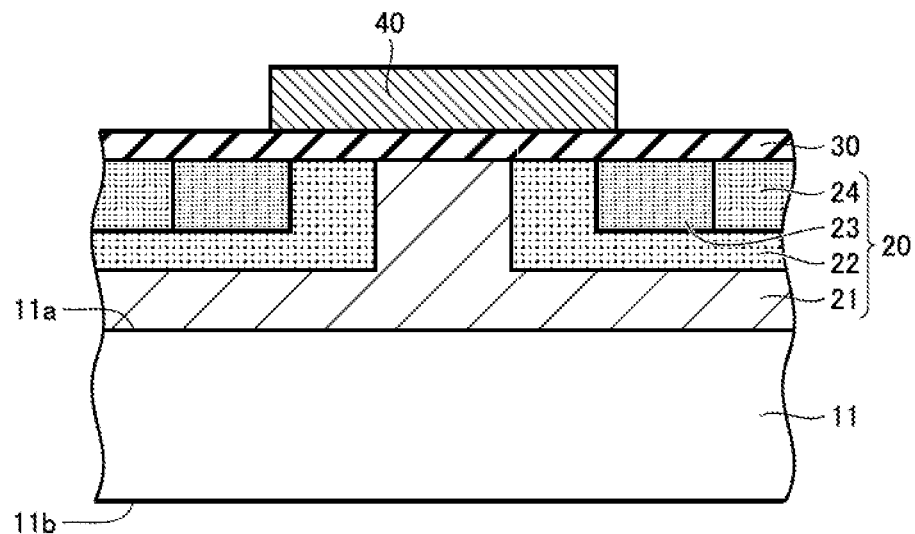
FIG. 8 is a schematic cross-sectional view schematically representing the second step of the method for manufacturing a silicon carbide semiconductor device according to one embodiment of the present invention.

Next, as Step (S23: FIG. 6), the gate oxide film forming step is implemented. In this Step (S23: FIG. 6), referring to FIG. 8, intermediate silicon carbide substrate 10 is heated in the atmosphere including, for example, oxygen to form gate oxide film 30 made of silicon dioxide so as to cover main surface 10a.

Next, as Step (S24: FIG. 6), the gate electrode forming step is implemented. In this Step (S24: FIG. 6), referring to FIG. 8, gate electrode 40, which comes into contact with gate oxide film 30 and is made of polysilicon containing impurities, is formed by, for example, an LPCVD (Low Pressure Chemical Vapor Deposition) method.

Next, as Step (S25: FIG. 6), the interlayer insulating film forming step is implemented. In this Step (S25: FIG. 6), interlayer insulating film 60 made of silicon dioxide is formed by, for example, a P (Plasma)-CVD so as to cover gate oxide film 30 and gate electrode 40.

Figure 9:
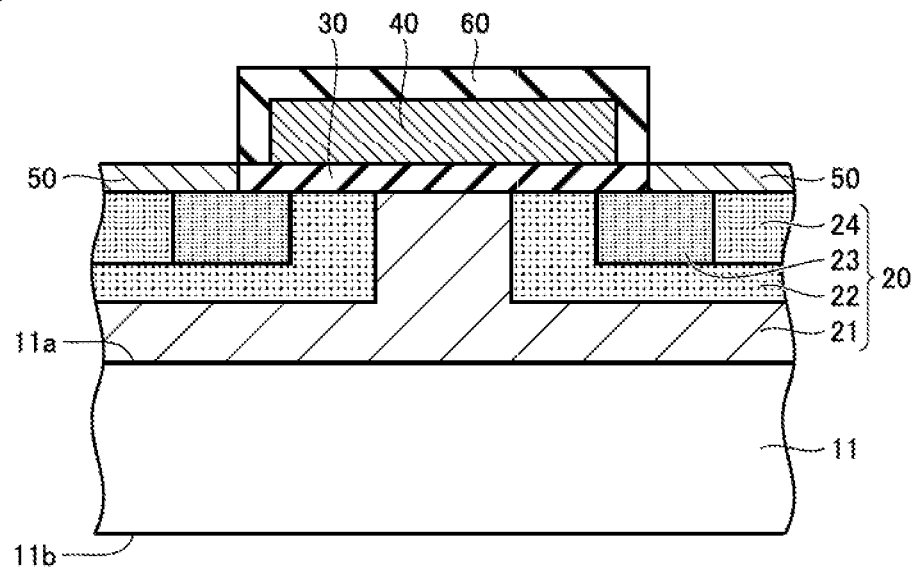
FIG. 9 is a schematic cross-sectional view schematically representing the third step of the method for manufacturing a silicon carbide semiconductor device according to one embodiment of the present invention.

Next, as Step (S26: FIG. 6), the source electrode forming step is implemented. In this Step (S26: FIG. 6), interlayer insulating film 60 and gate oxide film 30 are removed in the region where source electrode 50 should be formed, and a region where source region 23 and p+ region 24 are exposed is formed. Next, referring to FIG. 9, a metal layer containing, for example, NiSi (nickel silicon) or TiAlSi (titanium aluminum silicon) is formed in the region described above by, for example, sputtering. Then, the metal layer described above is heated, so that at least a part of the metal layer described above is silicided, and source electrode 50 is formed.

Figure 10:
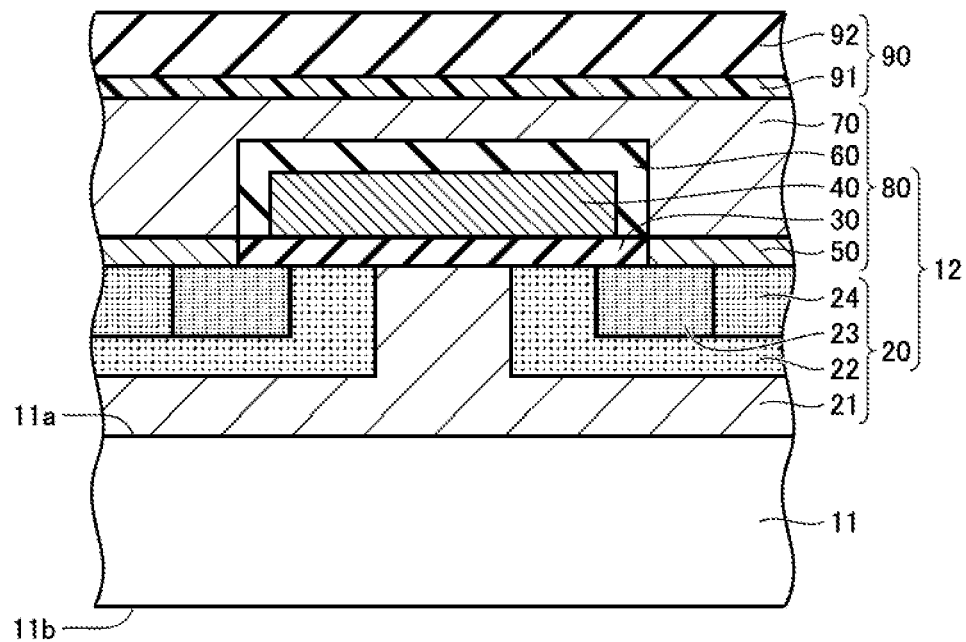
FIG. 10 is a schematic cross-sectional view schematically representing the fourth step of the method for manufacturing a silicon carbide semiconductor device according to one embodiment of the present invention.

Next, as Step (S27: FIG. 6), the surface protection electrode forming step is implemented. In this Step (S27: FIG. 6), referring to FIG. 10, surface protection electrode 70 in contact with source electrode 50 is formed. Specifically, firstly, a first electrode layer (not illustrated) made of Ta, TaN, Ti, TIN, or TiW is formed so as to come into contact with source electrode 50 by, for example, sputtering. Then, a second electrode layer (not illustrated) made of Al, AlSi, or AlSiCu is formed on the first electrode layer. In such a manner, surface protection electrode 70 is formed which has a structure in which the electrode layers are layered. Moreover, as the first electrode layer, the one having a structure in which an electrode layer made of Ta and TaN are layered may be formed.

As described above, an intermediate substrate having upper element structure 80 formed thereon including gate oxide film 30, gate electrode 40, source electrode 50, interlayer insulating film 60, and surface protection electrode 70, is prepared on main surface 10a of silicon carbide substrate 10.

Next, as Step (S30: FIG. 5), the base material pasting step is implemented. In this Step (S30: FIG. 5), referring to FIG. 10, base silicon carbide substrate 11 is fixed at base material 90 through upper element structure 12. Base material 90 has a higher flexibility than base silicon carbide substrate 11 fixed to the base material. In other words, base material 90 has a property of being more flexible than base silicon carbide substrate 11. Specifically, base material 90 is an adhesive tape constituted of, for example, organic compounds. Moreover, preferably, base material 90 has a higher flexibility than base silicon carbide substrate 11 ground by the silicon carbide removing step (grinding step) which will be described later.

Adhesive tape 90 includes, for example, a base portion 92 and an adhering portion 91 connected to base portion 92. As the material for base portion 92 and adhering portion 91, materials having various configurations can be employed. For example, organic compounds such as polyester can be employed as base portion 92, and an acrylic adhesive having an adhesive property can be employed as adhering portion 91.

Preferably, a material having an adhesion lowered by irradiation of energy rays such as ultraviolet rays is employed as adhesive adhering portion 91. As the material having an adhesion lowered by irradiation of energy rays such as ultraviolet rays, ultraviolet curing type resin may be included, for example. Moreover, as adhering portion 91, a material having an adhesion lowered by heating may be used. As the material having an adhesion lowered by heating, thermosetting resin may be included.

In the present embodiment, base material 90 is provided in contact with surface protection electrode 70 of upper element structure 12. However, base material 90 may be provided in contact with an insulating layer such as interlayer insulating film 60 of upper element structure 12.

In the present embodiment, adhesive tape 90 is described as an example of the base material. However, the base material may be constituted of, for example, a material having one surface with an adhesiveness and the other surface having no adhesiveness. Moreover, it is preferable that base material 90 is constituted of organic compounds having a flexibility. Further, it is preferable that base material 90 can be detached from base silicon carbide substrate 11 without use of a solvent.

Figure 11:
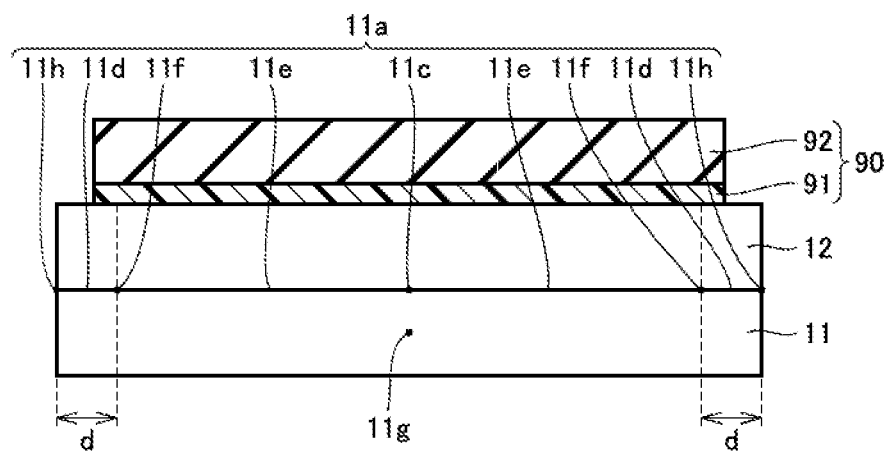
FIG. 11 is a schematic cross-sectional view schematically representing the fifth step of the method for manufacturing a silicon carbide semiconductor device according to one embodiment of the present invention.

Referring to FIG. 11, in the step of fixing base silicon carbide substrate 11 to base material 90, base material 90 is arranged at a position of covering center 11c of first main surface 11a so that base material 90 does not extend beyond outer circumference 11h of base silicon carbide substrate 11 in a view from a side of second main surface 11b of base silicon carbide substrate 11. Preferably, base material 90 is formed so as to entirely cover central region 11e of base silicon carbide substrate 11 and partially cover outer circumferential region 11d at a position of facing first main surface 11a of base silicon carbide substrate 11. In other words, a part of outer circumferential region 11d may be exposed without being covered with base material 90. Base material 90 has an area which is equal to or less than an area of first main surface 11a of base silicon carbide substrate 11. Preferably, base material 90 has an area equal to or less than 50% of the area of first main surface 11a, more preferably an area equal to or greater than 90% of the area of first main surface 11a. The area of base material 90 may be equal to the area of first main surface 11a. Moreover, it is preferable that base material 90 is arranged so as to entirely cover surface protection electrode 70.

More in detail, adhering portion 91 and base portion 92 of base material 90 entirely cover central region 11e of base silicon carbide substrate 11, and adhering portion 91 of base material 90 is in contact with central region 11e of base silicon carbide substrate 11 through upper element structure 12. Base portion 92 is formed so as to cover adhering portion 91. The area of base portion 92 may be equal to the area of adhering portion 91, or may be greater than the area of adhering portion 91. It should be noted that outer circumferential region 11d is a region within a distance d (d=1.5 mm) from outer circumference 11h of base silicon carbide substrate 11. Distance d may be 1.0 mm or 0.5 mm.

Figure 12:
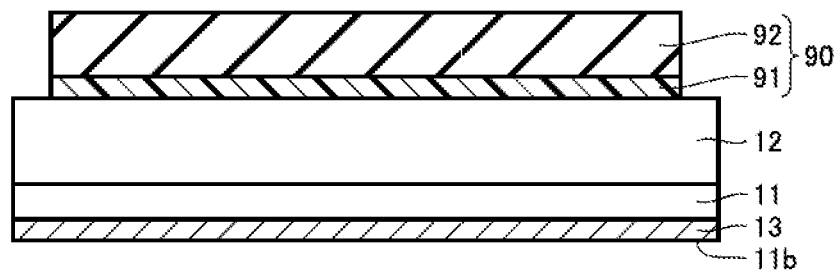
FIG. 12 is a schematic cross-sectional view schematically representing the sixth step of the method for manufacturing a silicon carbide semiconductor device according to one embodiment of the present invention.

Next, as Step (S40: FIG. 5), the back surface grinding step is implemented. In this Step (S40: FIG. 5), in the state where base silicon carbide substrate 11 and upper element structure 12 are fixed to adhesive tape 90 as the base material, silicon carbide crystal on a side of second main surface 11b of base silicon carbide substrate 11 is removed. Specifically, referring to FIG. 12, second main surface 11b of base silicon carbide substrate 11 is pushed to a grinding surface of a grinding device such as a grinding machine (not illustrated), so that silicon carbide crystal on a side of second main surface 11b of base silicon carbide substrate 11 is ground, thus base silicon carbide substrate 11 is thinned to have a desired thickness. It should be noted that, after base silicon carbide substrate 11 is ground, an affect layer 13 with a disarranged crystal state is formed on second main surface 11b of base silicon carbide substrate 11.

The thickness of base silicon carbide substrate 11 before the back surface grinding step is, for example, approximately 400 μm, and the thickness of base silicon carbide substrate 11 after the back surface grinding step is, for example, approximately 100 μm. The thickness of adhesive tape 90 is, for example, approximately greater than or equal to 100 μm and approximately less than or equal to 200 μm. In the present embodiment, it is described that the step of removing silicon carbide on a side of second main surface 11b of base silicon carbide substrate 11 is performed by grinding. However, it may be performed by, for example, polishing or dry etching.

Next, as Step (S50: FIG. 5), the degassing step is implemented. Specifically, base silicon carbide substrate 11 fixed to adhesive tape 90 through upper element structure 12 is heated to 100° C. or higher by means of, for example, a heater, so that impurities such as vapor included in adhesive tape 90 can be removed. Base silicon carbide substrate 11 fixed to adhesive tape 90 is preferably heated to 120° C. or higher and 200° C. or lower, more preferably retained at 140° C. or higher and 180° C. or lower.

Next, as Step (S60: FIG. 5), the dry etching step is implemented. Specifically, referring to FIG. 12, process damaged layer 13 made of silicon carbide formed on second main surface 11b of base silicon carbide substrate 11 having the back surface ground in Step (S40: FIG. 5) is removed by dry etching. Process damaged layer 13 can be removed from base silicon carbide substrate 11 by reactive ion etching with use of $SF_6$ as reactive gas.

Next, the sputter etching step is implemented as Step (S70: FIG. 5). Specifically, for example, base silicon carbide substrate 11 fixed to adhesive tape 90 is arranged in the argon atmosphere, and the sputter etching is performed, so that residues due to $SF_6$ adhered to second main surface 11b of base silicon carbide substrate 11 is removed.

Next, as Step (S80: FIG. 5), the back surface electrode forming step is implemented. In the back surface electrode forming step, a metal layer is formed on second main surface 11b of base silicon carbide substrate 11. Specifically, in the state where base silicon carbide substrate 11 is fixed to adhesive tape 90 as the base material, a metal layer made of, for example, NiSi is formed on second main surface 11b of base silicon carbide substrate 11 from which the silicon carbide crystal is removed. The metal layer may be, for example, TiAlSi. The formation of the metal layer is implemented preferably by the sputtering method. The formation of the metal layer may be implemented by vapor deposition.

Figure 13:
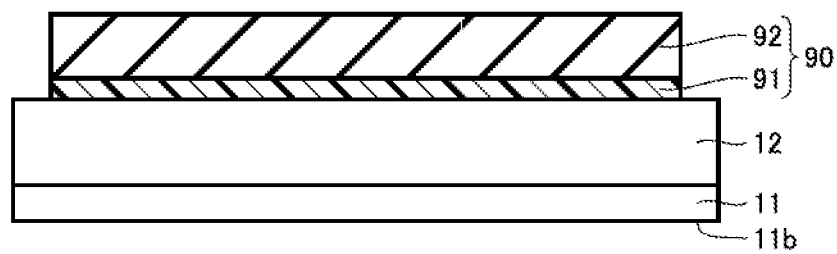
FIG. 13 is a schematic cross-sectional view schematically representing the seventh step of the method for manufacturing a silicon carbide semiconductor device according to one embodiment of the present invention.
Figure 14:
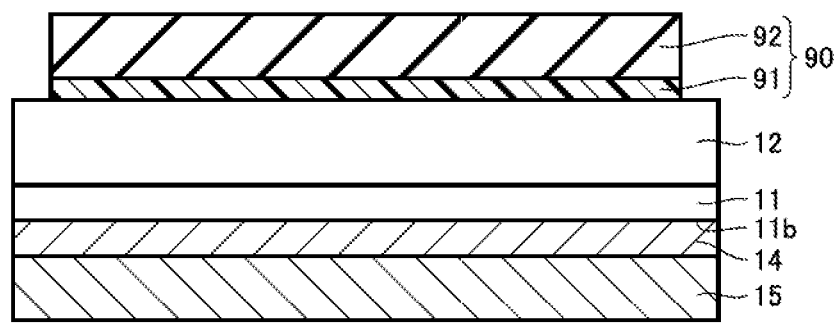
FIG. 14 is a schematic cross-sectional view schematically representing the eighth step of the method for manufacturing a silicon carbide semiconductor device according to one embodiment of the present invention.

Next, as Step (S90: FIG. 5), the annealing step is implemented. The metal layer formed in Step (S80: FIG. 2) is heated, so that the metal layer is alloyed to be drain electrode 14. Specifically, referring to FIG. 13, the metal layer is heated to approximately 1000° C. with use of, for example, laser irradiation, so that at least a part of the metal layer is silicided to be drain electrode 14. Drain electrode 14 is in ohmic junction with base silicon carbide substrate 11. After that, the degassing similar to Step (S50: FIG. 5) and the sputter etching step similar to Step (S70: FIG. 5) may be implemented, Next, as Step (S100: FIG. 5), the back surface protection electrode forming step is implemented. In this Step (S100, FIG. 5), referring to FIG. 14, in the state where base silicon carbide substrate 11 is fixed at adhesive tape 90, back surface protection electrode 15 in contact with drain electrode 14 is formed. Back surface protection electrode 15 includes, for example, Ti atoms, Pt atoms, and Au atoms. Specifically, firstly, a first electrode layer (not illustrated) made of Ti, TiN, TiW, or NiCr is formed so as to come into contact with drain electrode 11 by, for example, sputtering. Next, similarly, a second electrode layer (not illustrated) made of Pt or Ni is formed on the first electrode layer by sputtering. Then, similarly, a third electrode layer (not illustrated) made of Au or Ag is formed on the second electrode layer by sputtering. In such a manner, back surface protection electrode 15 having a layered structure of the electrode layers is formed on drain electrode 14.

It should be noted that, from the dry etching step through the formation of the back surface electrode, base silicon carbide substrate 11 fixed to adhesive tape 90 is preferably retained in vacuum. Here, the vacuum is the atmosphere having an oxygen partial pressure of less than or equal to $1 \times 10^{-4}$ Pa. Preferably, the vacuum is the atmosphere having an oxygen partial pressure of less than or equal to $1 \times 10^{-5}$ Pa.

Figure 16:
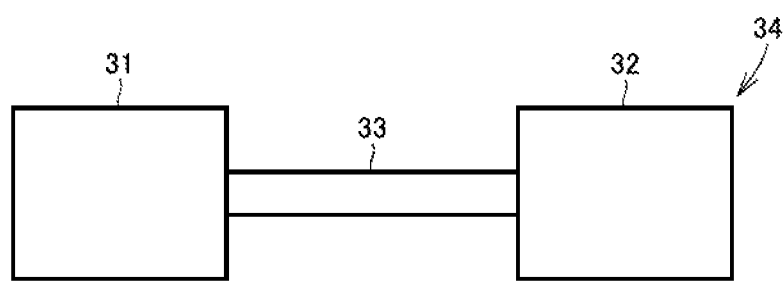
FIG. 16 is a schematic view for schematic explanation of the method for manufacturing a silicon carbide semiconductor device according to one embodiment of the present invention.

Specifically, referring to FIG. 16, in the dry etching step, base silicon carbide substrate 11 fixed to adhesive tape 90 is arranged in a chamber 31 for dry etching, and chamber 31 is in the vacuum state. Base silicon carbide substrate 11 is transferred through a chamber 33 to a chamber 32 for forming an electrode film atmosphere while being in the vacuum state without being exposed to air. Thereafter, in chamber 32 in the vacuum, a metal layer as drain electrode 14 is formed at second main surface 11b of base silicon carbide substrate 11.

Figure 15:
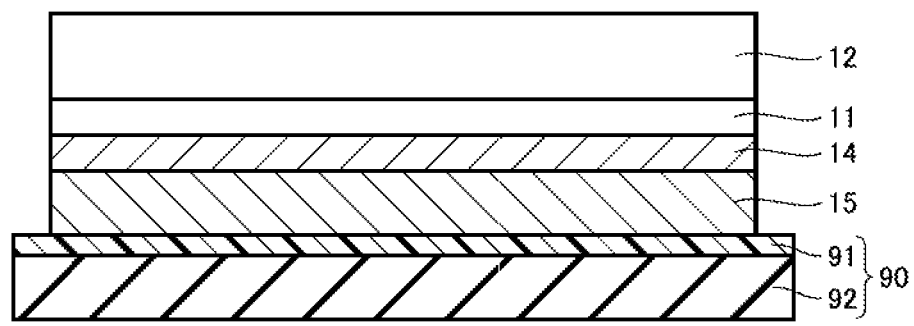
FIG. 15 is a schematic cross-sectional view schematically representing the ninth step of the method for manufacturing a silicon carbide semiconductor device according to one embodiment of the present invention.

Next, as Step (S110: FIG. 5), the base material replacing step is implemented. In the base material replacing step, referring to FIG. 15, adhesive tape 90 as the base material having been in contact with upper element structure 12 is removed. Back surface protection electrode 15 formed on the side of second main surface 11b of base silicon carbide substrate 11 is fixed to new adhesive tape 90. The area of new adhesive tape 90 may be larger than first main surface 11a and second main surface 11b of base silicon carbide substrate 11 or may be smaller than or equal to first main surface 11a and second main surface 11b of base silicon carbide substrate 11. As described above, upper element structure 12 on base silicon carbide substrate 11 is exposed, and base silicon carbide substrate 11 is fixed to adhesive tape 90 through drain electrode 14 and back surface protection electrode 15.

Next, the dicing step is implemented. In the dicing step, in the state where upper element structure 12 on base silicon carbide substrate 11 is exposed, and base silicon carbide substrate 11 is fixed to adhesive tape 90 through drain electrode 14 and back surface protection electrode 15, a plurality of MOSFETs 100 can be obtained by cutting upper element structure 12, base silicon carbide substrate 11, drain electrode 14, and back surface protection electrode 15 in the thickness direction of base silicon carbide substrate 11. This cutting may be implemented by laser dicing or scribe. MOSFET 100 as the silicon carbide semiconductor device is manufactured by the implementation of the steps described above.

It should be noted that a MOSFET having a configuration with the n-type and p-type replaced in the embodiment described above may be used. Moreover, although the planar MOSFET is described as one example of a silicon carbide semiconductor device of the present invention in the description above, the silicon carbide semiconductor device may be a trench-type MOSFET or an IGBT (Insulated Gate Bipolar Transistor).

Next, effects of the manufacturing method of the present embodiment will be described.

According to the method for manufacturing MOSFET 100 of the present embodiment, base silicon carbide substrate 11 is fixed to adhesive tape 90 so that adhesive tape 90 does not extend beyond first main surface 11a of base silicon carbide substrate 11, and drain electrode 14 is formed on second main surface 11b of base silicon carbide substrate 11 in the state where base silicon carbide substrate 11 is fixed to adhesive tape 90. Accordingly, when drain electrode 14 is formed, generation of impurities such as vapor from adhesive tape 90 can be suppressed. Consequently, since the rise in the contact resistance between base silicon carbide substrate 11 and drain electrode 14 due to the impurities such as vapor can be suppressed, MOSFET 100 having a low contact resistance between base silicon carbide substrate 11 and drain electrode 14 can be manufactured.

Moreover, according to the method for manufacturing MOSFET 100 of the present embodiment, base silicon carbide substrate 11 is fixed to adhesive tape 90 having a higher flexibility than base silicon carbide substrate 11. Therefore, adhesive tape 90 can be removed from base silicon carbide substrate 11 without giving an excessive stress to base silicon carbide substrate 11. Consequently, MOSFET 100 can be manufactured in a simple manner without using a solvent for removing adhesive tape 90.

Further, according to MOSFET 100 of the present embodiment, first main surface 11a is constituted of outer circumferential region 11d, which is a region within 1.5 mm from outer circumference 11h of first main surface 11a to center 11c, and central region 11e surrounded by outer circumferential region 11d. Adhesive tape 90 entirely covers central region 11e. Accordingly, central region 11e of base silicon carbide substrate 11 can be entirely protected by adhesive tape 90.

Further, according to the method for manufacturing MOSFET 100 of the present embodiment, the step of removing silicon carbide includes the grinding step. Accordingly, base silicon carbide substrate 11 can have a desired thickness efficiently.

Further, according to the method for manufacturing MOSFET 100 of the present embodiment, the step of removing silicon, carbide further includes the dry etching step implemented after the grinding step. In the dry etching step, process damaged layer 13 formed on second main surface 11b in the grinding step is removed. Accordingly, the contact resistance between base silicon carbide substrate 11 and drain electrode 14 can be further reduced.

Further, according to the method for manufacturing MOSFET 100 of the present embodiment, the step of removing silicon carbide further includes the sputter etching step implemented after the dry etching step. Accordingly, impurities adhered to base silicon carbide substrate 11 in the dry etching step can be removed. Consequently, the contact resistance between base silicon carbide substrate 11 and drain electrode 14 can be further reduced.

Further, according to the method for manufacturing MOSFET 100 of the present embodiment, base silicon carbide substrate 11 is retained in vacuum from the dry etching step through the step of forming drain electrode 14. Accordingly, the oxidization of second main surface 11b of base silicon carbide substrate 11 can be suppressed. Consequently, the contact resistance between base silicon carbide substrate 11 and drain electrode 14 can be further reduced.

Further, according to the method for manufacturing MOSFET 100 of the present embodiment, second main surface 11b is a silicon surface. Accordingly, in the case where second main surface 11b is a silicon surface, the contact resistance between base silicon carbide substrate 11 and drain electrode 14 can be reduced. Moreover, it is difficult to implement the CMP (Chemical Mechanical Polishing) or the dry polishing with respect to a silicon surface. Therefore, it is preferable that the step of removing silicon carbide on the side of second main surface 11b of base silicon carbide substrate 11 is performed by grinding. When silicon carbide on the side of second main surface 11b is removed in the grinding step, process damaged layer 13 is formed on second main surface 11b. Therefore, in the case where the second main surface is a silicon surface, the dry etching step for removing process damaged layer 13 is required. Therefore, the method for manufacturing MOSFET 100 according to the present embodiment having the grinding step and the dry etching step is suitably used when a drain electrode is formed on a silicon surface.

According to the method for manufacturing MOSFET 100 of the present embodiment, adhesive tape 90 includes base portion 92 and adhering portion 91 connected to base portion 92. In the step of fixing to adhesive tape 90, base silicon carbide substrate 11 is fixed to base portion 92 by means of adhering portion 91. Accordingly, base silicon carbide substrate 11 is fixed to adhesive tape 90 in a simple manner.

Further, according to MOSFET 100 of the present embodiment, base portion 92 is made of organic compounds. Accordingly, a flexibility of the adhesive tape can be improved.

Further, according to the method for manufacturing MOSFET 100 of the present embodiment, adhering portion 91 has a property that the adhesion is lowered by heating. Accordingly, base silicon carbide substrate 11 can be removed from adhesive tape 90 in a simple manner.

Further, according to the method for manufacturing MOSFET 100 of the present embodiment, adhering portion 91 has a property that the adhesion is lowered by irradiation of ultraviolet rays. Accordingly, base silicon carbide substrate 11 can be removed from adhesive tape 90 in a simple manner.

It is to be understood that the embodiments and examples disclosed herein are only by way of example, and not to be taken by way of limitation. The scope of the present invention is not limited by the description above, but rather by the terms of the appended claims, and is intended to include any modifications within the scope and meaning equivalent to the terms of the claims.

REFERENCE SIGN LIST 10 intermediate silicon carbide substrate; 10a main surface; 11 base silicon carbide substrate; 11a first main surface; 11b second main surface; 12 upper element structure; 13 process damaged layer; 14 drain electrode; 15 back surface protection electrode; 20 epitaxial layer; 21 drift region; 22 body region; 23 source region; 24 p+ region; 30 gate oxide film; 31 to 33 chamber; 40 gate electrode; 50 source electrode; 60 interlayer insulating film; 70 surface protection electrode; 90 adhesive tape (base material); 100 MOSFET.

The invention claimed is:

1. A method for manufacturing a silicon carbide semiconductor device, comprising the steps of:
    fixing a silicon carbide substrate having a first main surface and a second main surface opposite to each other to a base material having a higher flexibility than said silicon carbide substrate;
    removing silicon carbide on a side of said second main surface of said silicon carbide substrate in a state where said silicon carbide substrate is fixed to said base material; and
    forming an electrode on said second main surface of said silicon carbide substrate from which said silicon carbide is removed in a state where said silicon carbide substrate is fixed to said base material,
    said base material having an area smaller than or equal to an area of said first main surface of said silicon carbide substrate,
    in said step of fixing to a base material, said base material is arranged at a position of covering a center of said first main surface so that said base material does not extend beyond an outer circumference of said first main surface,
    said first main surface includes an outer circumferential region, which is a region within 1.5 mm from said outer circumference of said first main surface towards said center, and a central region surrounded by said outer circumferential region,
    said base material entirely covers said central region, and a part of said outer circumferential region is exposed without being covered with said base material.

2. The method for manufacturing silicon carbide semiconductor device according to claim 1, wherein said step of removing said silicon carbide includes a grinding step.

3. The method for manufacturing a silicon carbide semiconductor device according to claim 2, wherein
    said step of removing silicon carbide further includes a dry etching step implemented after said grinding step, and
    in said dry etching step, a process damaged layer formed on said second main surface in said grinding step is removed.

4. The method for manufacturing a silicon carbide semiconductor device according to claim 3, wherein said step of removing silicon carbide further includes a sputter etching step implemented after said dry etching step.

5. The method for manufacturing a silicon carbide semiconductor device according to claim 3, wherein said silicon carbide substrate is retained in vacuum from said dry etching step through said step of forming an electrode.

6. The method for manufacturing a silicon carbide semiconductor device according to claim 1, wherein said second main surface is a silicon plane.

7. The method for manufacturing a silicon carbide semiconductor device according to claim 1, wherein
    said base material includes a base portion and an adhering portion connected to said base portion, and
    in said step of fixing to a base material, said silicon carbide substrate is fixed to said base portion by said adhering portion.

8. The method for manufacturing a silicon carbide semiconductor device according to claim 7, wherein said base portion is made of organic compounds.

9. The method for manufacturing a silicon carbide semiconductor device according to claim 7, wherein said adhering portion has a property that an adhesion is lowered by heating.

10. The method for manufacturing a silicon carbide semiconductor device according to claim 7, wherein said adhering portion has a property that an adhesion is lowered by irradiation of ultraviolet rays.

* * * * *